United States Patent [19]

Kobayashi et al.

[11] Patent Number: 4,603,377
[45] Date of Patent: Jul. 29, 1986

[54] MAIN DISTRIBUTING FRAME BOARD FOR AN ELECTRONIC SWITCHING SYSTEM

[75] Inventors: Toshiji Kobayashi; Nobuhiko Eguchi; Shigeru Sato, all of Tokyo, Japan

[73] Assignee: NEC Corporation, Tokyo, Japan

[21] Appl. No.: 662,995

[22] Filed: Oct. 19, 1984

[30] Foreign Application Priority Data

| Oct. 24, 1984 | [JP] | Japan | 59-198450 |
| Oct. 24, 1984 | [JP] | Japan | 59-198451 |
| Oct. 24, 1984 | [JP] | Japan | 59-198452 |
| Oct. 24, 1984 | [JP] | Japan | 59-198453 |

[51] Int. Cl.$^4$ .............................................. H02B 1/04
[52] U.S. Cl. .................................... 361/429; 361/413; 361/425; 361/428; 179/98; 339/198 G
[58] Field of Search ............ 361/331, 332, 425, 426, 361/428, 429, 412, 413, 407, 415; 174/72 A; 179/98; 339/18 R, 14 R, 198 R, 198 S, 198 G

[56] References Cited

U.S. PATENT DOCUMENTS

| 3,106,614 | 10/1963 | Stoehr | 179/91 R |
| 3,942,077 | 3/1976 | Powers | 179/98 |
| 4,002,856 | 1/1977 | Sedlacek | 179/98 |
| 4,204,095 | 5/1980 | De Luca | 361/428 |
| 4,320,261 | 3/1982 | Scerbo | 179/98 |

OTHER PUBLICATIONS

Cosmac II Frame System by Louis J. Scerbo and John T. Sibilla.

Primary Examiner—G. P. Tolin
Attorney, Agent, or Firm—Laff, Whitesel, Conte & Saret

[57] ABSTRACT

A main distribution board is designed to be mounted on a main distribution frame ("MDF") of a switching office for interconnecting inside and outside cables. A plug-in type connector is connected to the end of the inside cable. A first terminal block has U-groove clip terminals which are connected to the plug-in connector. A second terminal block has U-groove clip terminals which are connected via jumper wires to the clip terminals of the first terminal block. A third terminal block has U-groove clip terminals which are connected to the outside cable. A receptacle having female contact terminals is connected to the clip terminals of the second and third terminal blocks, the receptacle also having a female contact terminal for making a ground connection. This receptacle also receives male contact terminals of a protector module which includes a protection device. At least one back wiring board has the connector, the first, second and third terminal blocks and the receptacle mounted thereon. A shelf has the back wiring board fixed thereon for mounting the connector, the first, second and third terminal blocks, and the receptacle on the MDF, in an integrated form.

18 Claims, 13 Drawing Figures

MAIN DISTRIBUTING FRAME BOARD FOR AN ELECTRONIC SWITCHING SYSTEM

BACKGROUND OF THE INVENTION

This invention relates to a main distributing frame ("MDF") and, more particularly, to an MDF board having a line protector for preventing associated switching equipment from overvoltage and overcurrent arising on a communication line due to lightning or contact with a power line. The inventive MDF board also has a terminal block for distributing outside cables to the switching equipment.

Recently, the electronic construction of switching systems has been rapidly promoted to cope with the diversification of various communication services. Particularly, electronic office switching systems have become miniaturized by the use of semiconductor devices as the structural elements, thus reducing the size of the system to be installed. Similarly, it is desirable to reduce the size of the MDF for distributing outside cables having from several thousand lines to tens of thousands of lines. Further, it is desirable for the period of time required for the completion of the system construction to be further reduced by shortening the time required for wiring of a large quantity of cables to the MDF and for mounting and installing equipment and devices on the MDF.

One example of an MDF to achieve such a requirement has been described in an article by Louis J. Scerbo et al. entitled "COSMIC II frame system: the solution to central office growth", published in April 1981 in "the Bell Laboratories Record". However, in the described MDF, a protector unit is provided with a plurality of line protectors. A connector block, for connecting jumper wires through a cable, is connected to the MDF by a manufacturing company prior to the delivery of the MDF to a switching office. Also, the connector block is mounted on a shelf at the front side of an MDF frame. The protector unit is mounted on a shelf at the rear of the frame or in a compartment; therefore, at least two people are needed for this mounting prior art equipment. On the other hand, the wiring is applied to the protector unit and the connector block through a use of wire wrapping connection by the manufacturing company. After the delivery, outside and inside cables are connected to the unit and block, the connections being made on the back surface each as rotating by a rotary mechanism. As a result, an increasing number of processes are inevitably required for the connection work, with the results that the completion of the total system installation will be prolonged. The installation space becomes larger, to limit the miniaturization of individual devices which are to be mounted on the MDF.

SUMMARY OF THE INVENTION

An object of this invention is, therefore, to provide an MDF board wherein space occupancy can be reduced through miniaturization by mounting a receptacle of a protector module and various terminal blocks in an integrated form.

Another object of this invention is to provide an MDF board wherein a number of processes for connecting wires or cables is decreased to shorten a system installation period by using a back wiring board, a U-groove clip terminal and a plug-in type connector.

According to one aspect of the invention, an MDF board is mounted on an MDF of a switching office for interconnecting an inside cable and an outside cable. A plug-in type connector is connected to the inside cable; a first terminal block having U-groove clip terminals is connected to the connector; and a second terminal block having U-groove clip terminals is connected through jumper wires to the clip terminals of the first terminal block. A third terminal block has U-groove clip terminals and is connected to the outside cable. A receptacle having female contact terminals is connected to the clip terminals of the second and third terminal blocks. A female contact terminal provides for ground connections and for receiving male contact terminals of a protector module having a protection device. At least one back wiring board carries the connector, the first, second and third terminal blocks and the receptacle. A shelf has the back wiring board fixed thereon for mounting the connector, the first, second and third terminal blocks, and the receptacle on the MDF in an integrated form.

BRIEF DESCRIPTION OF THE DRAWINGS

The above and other objects and features of the invention may be fully understood from the following detailed description and the accompanying drawings in which.

In the drawings, identical reference numerals denote identical structural elements.

DESCRIPTION OF THE PREFERRED EMBODIMENTS

Figure 1:
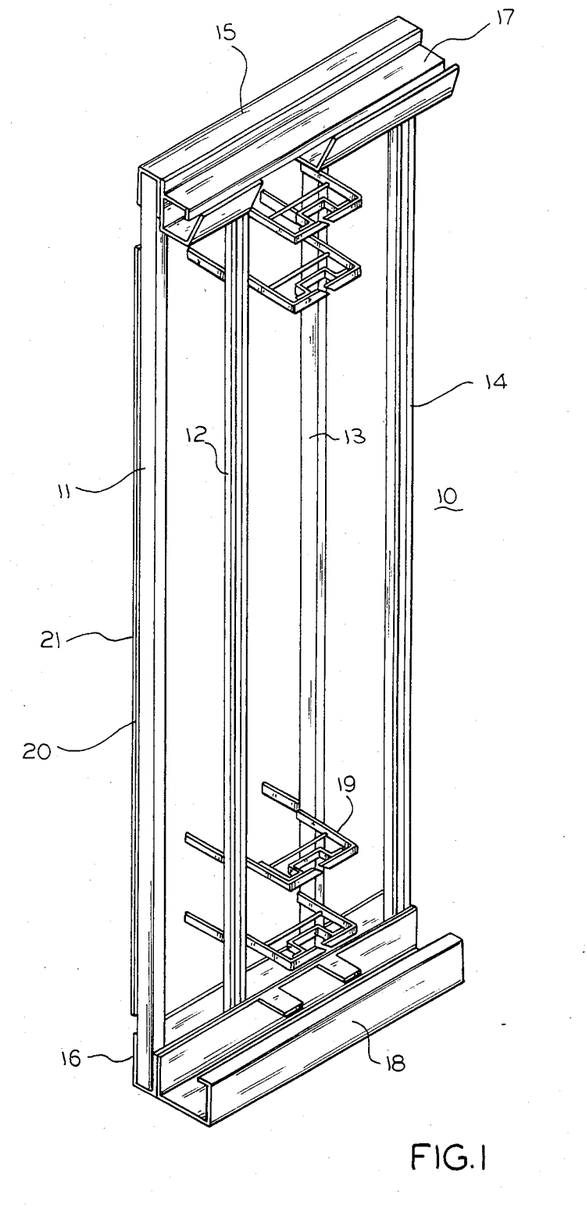
FIG. 1 is a perspective view of a first embodiment of the invention.

Referring to FIG. 1, a frame 10, provided with an MDF board employed in the first embodiment of the invention, comprises first, second, third and fourth vertical frame members 11, 12, 13 and 14. These members are C-shaped in cross-section and are opposite each other at predetermined intervals. The frame 10 also has horizontal frame members 15 and 16, which are U-shaped in cross-section and are fixed on the tops and bottoms of the vertical frame members 11, 12, 13 and 14 respectively. Jumper ducts 17 and 18 are fixed in front of the horizontal frame members 15 and 16 to pass jumper wires. Ten pieces of cable supports 19 (only 4 representative pieces being illustrated) are fixed on the back of the second and third vertical frame members 12 and 13, each support having clamping members (not shown). Ground bars 21 are clamped on the members 11 and 14, but are separated therefrom by insulation spacers 20.

The above constituted MDF frame 10 is normally assembled in a factory by a manufacturing company and delivered to a switching office. A double-sided MDF board, described in detail hereinafter, is mounted in 10 pieces, each piece being secured between the first and second vertical frame members 11 and 12 and the third and fourth vertical frame members 13 and 14. Since an outside (subscriber) cable of 100 lines per piece can be distributively connected to the MDF board, one frame 10 is capable of accepting a maximum of 2,000 lines. Further, the frame 10 is 2,700 mm high, 880 mm wide and 500 mm deep. Hence occupancy space can be saved.

Figure 2:
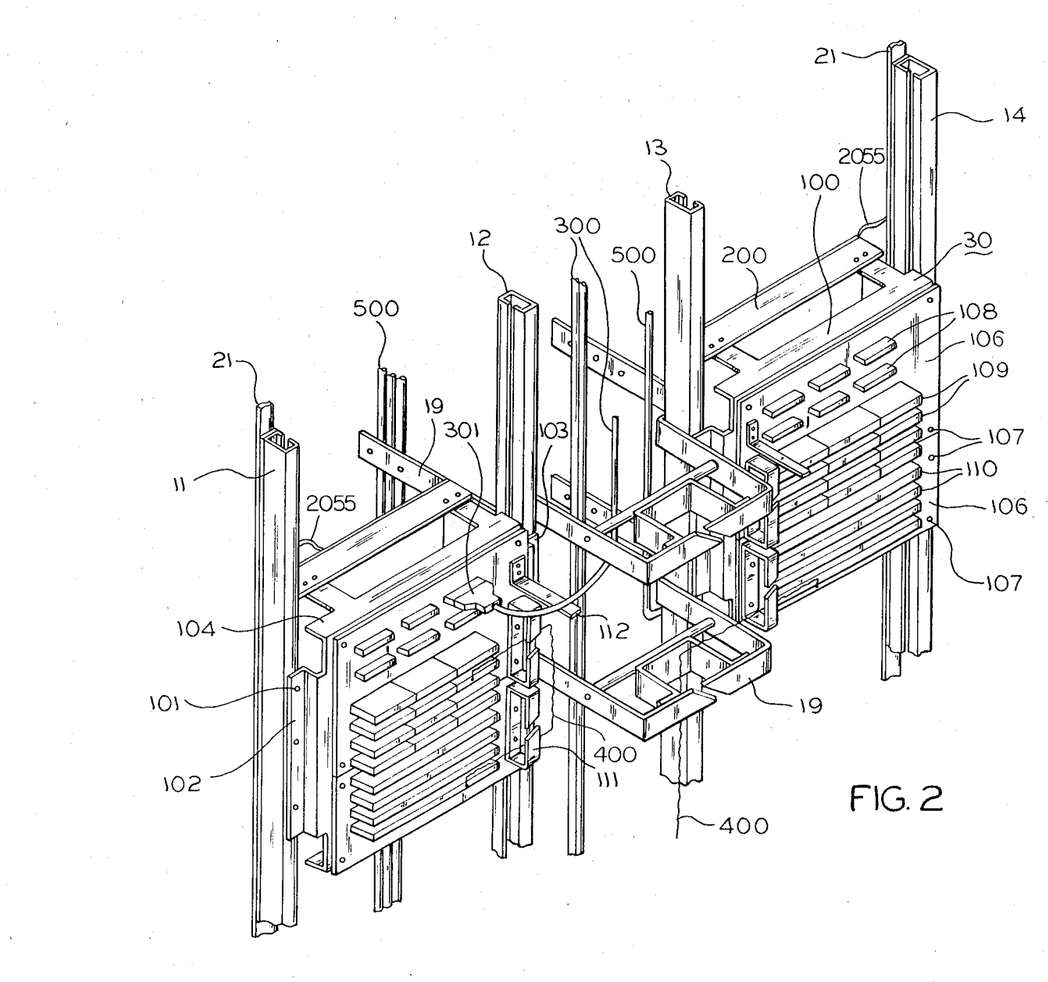
FIGS. 2, 3A and 3B are perspective views of an MDF board mounted on an MDF frame shown in FIG. 1.
Figure 3A:
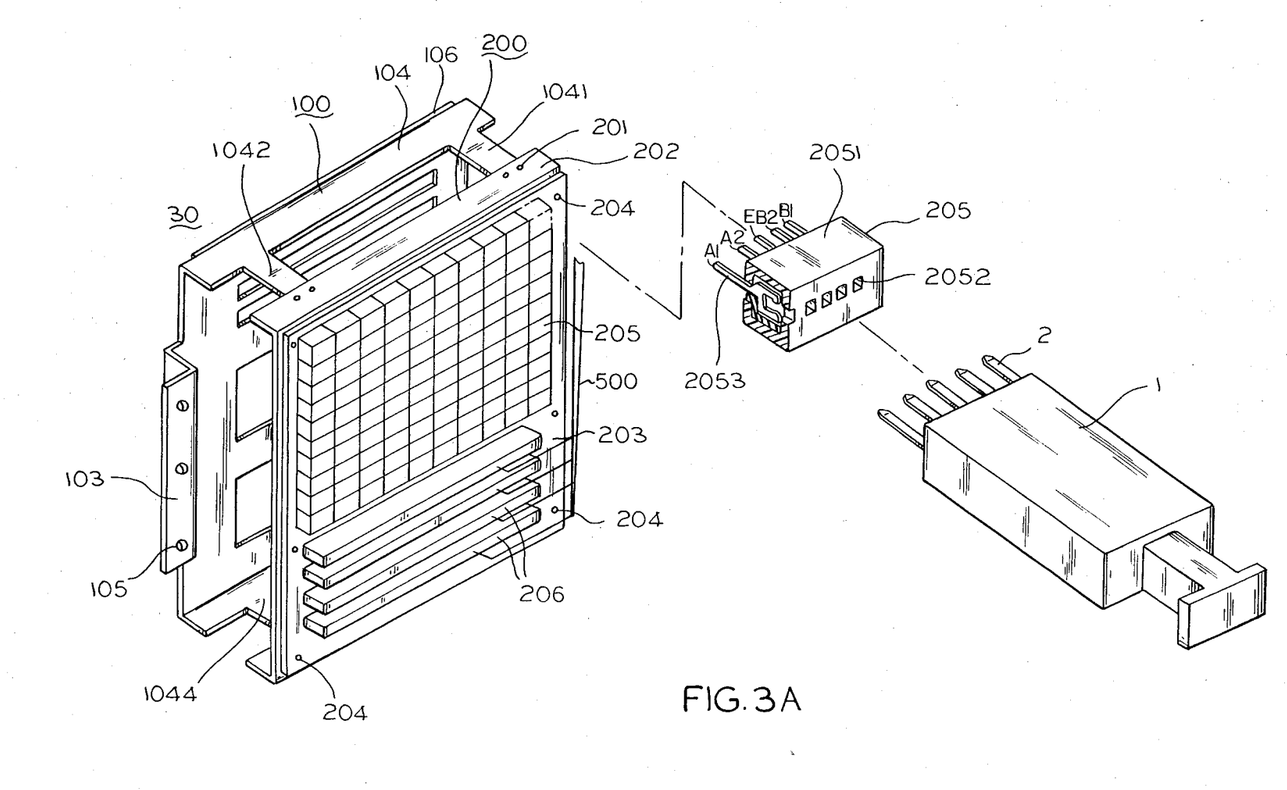
Figure 3B:
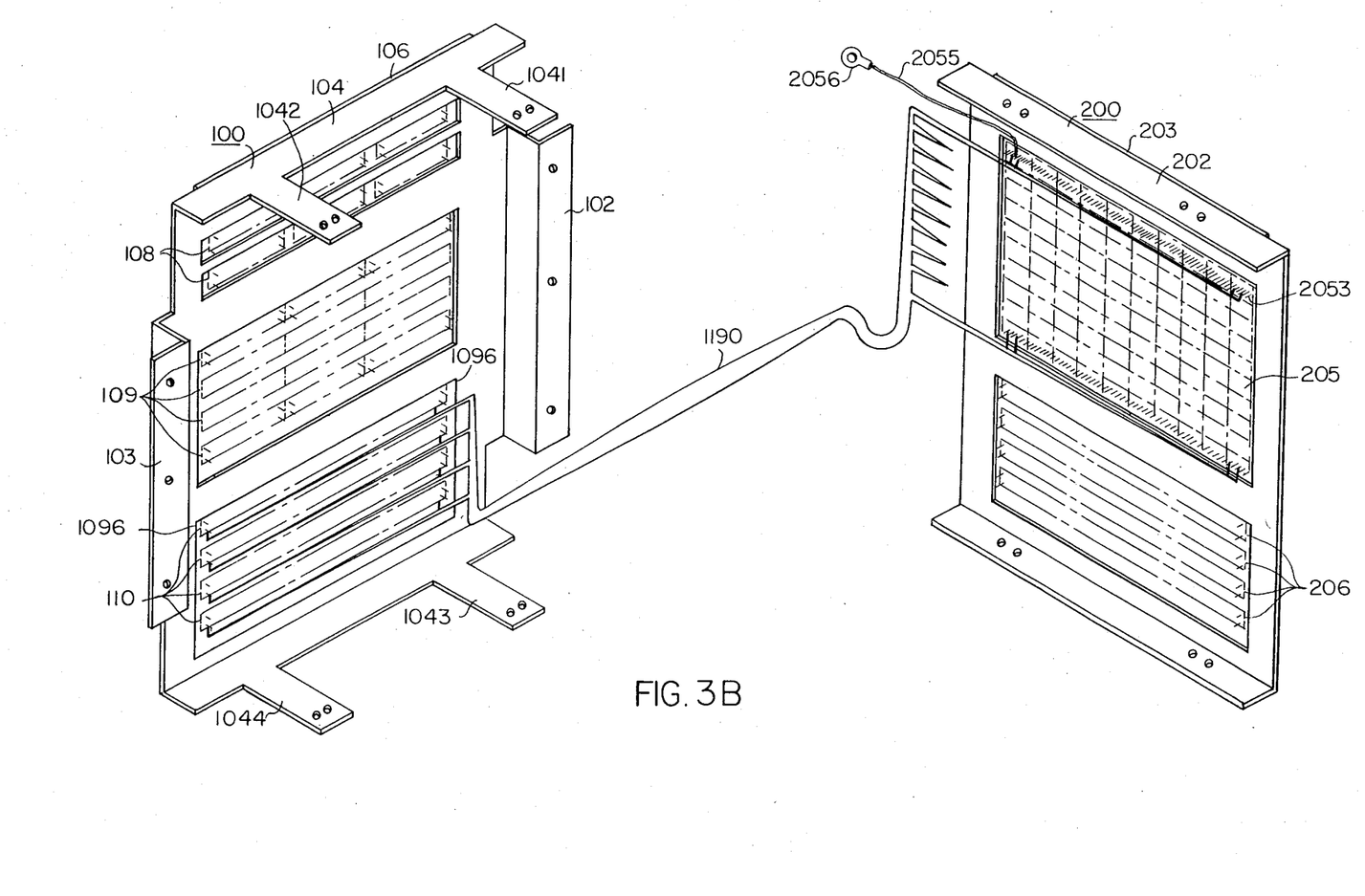

Next, referring to FIGS. 2, 3A and 3B, a MDF board 30 of the first embodiment is mounted on the MDF frame 10. This board is double-sided and is constituted by a first board assembly 100 positioned on the front side of the frame members 11 and 12 of the frame 10 or the frame members 13 and 14. A second board assembly 200 is positioned on the rear side of these vertical frame members. The first board assembly 100 has a pair of nearly L-shaped brackets 102 and 103 for fixing the MDF board 30 on the frame members 11 and 12 or the frame members 13 and 14, through the use of a clamping member 101. A first mounting shelf 104 consists of a metallic material. A clamping member 101 is inserted through hole 105 on each of the paired brackets 102 and 103. Glass epoxy resin back wiring boards (BWBs) 106 are fixed on the shelf 104 with nylon rivets 107.

Then, two rows forming 6-pieces of male-type interface connectors 108 receive female-type interface connectors 301 of inside (interface) cables 300, each of which is connected to office switching equipment. Connectors 108 are mounted on the tops of the BWBs 106. Each of these male connectors 108 accepts 16 lines and a normal plug-in type connector (as shown in an advertisement of the DuPont Company described on Page 59E, Mar. 4, 1982 in "*Electronic Design*") can be applied thereto. Further, 12-pieces (8-lines being acceptable per piece) of first terminal blocks 109 are disposed in four rows which are mounted at the center portion of the BWBs 106. There are 4-pieces (25 lines being acceptable per piece) of second terminal blocks 110 disposed in four rows and mounted on the lower portion thereof. A number of U-groove clip terminals with a wire press-connection portion (U-groove portion) on a front side, as described in detail hereinafter, of each of the terminal blocks 109 and 110. Jumper wires 400 are connected to the clip terminals.

Further, two jumper rings 111 straighten jumper wires 400 and a cable support 112 holds the inside cable 300. Rings 111 and support 112 are disposed on an end portion of the BWBs 106 adjacent the vertical frame member 12 or the vertical frame member 13. Nylon rivets 107 fix the jumper rings 111 and the cable support 112 through the BWBs 106 to the first mounting shelf 104.

On the other hand, the second board assembly 200 FIGS. 3A and 3B has a second mounting shelf 202 consisting of a metallic material which is coupled to four parts of arms 1041, 1042, 1043 and 1044 (1043 not illustrated) extending backwardly on the shelf 104 of the board assembly 100, attachment being accomplished by a clamping member 201. A glass epoxy resin BWB 203 is fixed on the mounting shelf 202 by means of nylon rivets 204. One hundred receptacles 205 (10×10 for 100 lines) accept line protector modules 1 and are mounted in a matrix on the BWB 203 at an upper portion and a center portion.

As shown in FIG. 3A, each receptacle 205 is composed of a synthetic resin housing 2051 and five pieces of thin-platelike U-groove contact terminals 2053 (A1, A2, B1, B2 and E) enclosed in the housing. These terminals correspond to 5-perforations 2052 exposed in a row on one surface of the housing 2051. Accordingly, each of the line protector modules 1 which is inserted in each of the receptacles 205 has five pieces of thin-platelike male terminals 2 projecting in a row. Each receptacle 205 can be miniaturized considerably to have dimensions of, for example, 12 mm high, 25 mm wide and 15 mm deep, by forming each of the contact terminals 2053 as a thin plate and by arraying them in a row. Consequently, the second board assembly 200 can then be miniaturized. The receptacles 205 will be connected electrically and mechanically by a lead portion of the contact terminals 2053, projecting from the housing 2051, soldered to a through-hole (not shown) on the BWB 203.

Four pieces (25 lines being acceptable per piece) of third terminal blocks 206 are disposed in four rows and are connected to an outside cable 500, for making a terminal-connection to a subscriber line. Blocks 206 are mounted on the lower portion of the BWB 203. As will be described in detail hereinafter, U-groove clip terminals have a wire press-connection portion projecting on the front side. These terminals are provided on the terminal blocks 206, as in the case of the first and second terminal blocks 109 and 110 of the board assembly 100. The outside cable 500 is connected with the clip terminals. Then, corresponding portions of the first and second mounting shelves 104 and 202 are joined at a location where the connectors 108, the first, second and third teminal blocks 109, 110 and 206, and the receptacles 205 are mounted.

Figure 4:
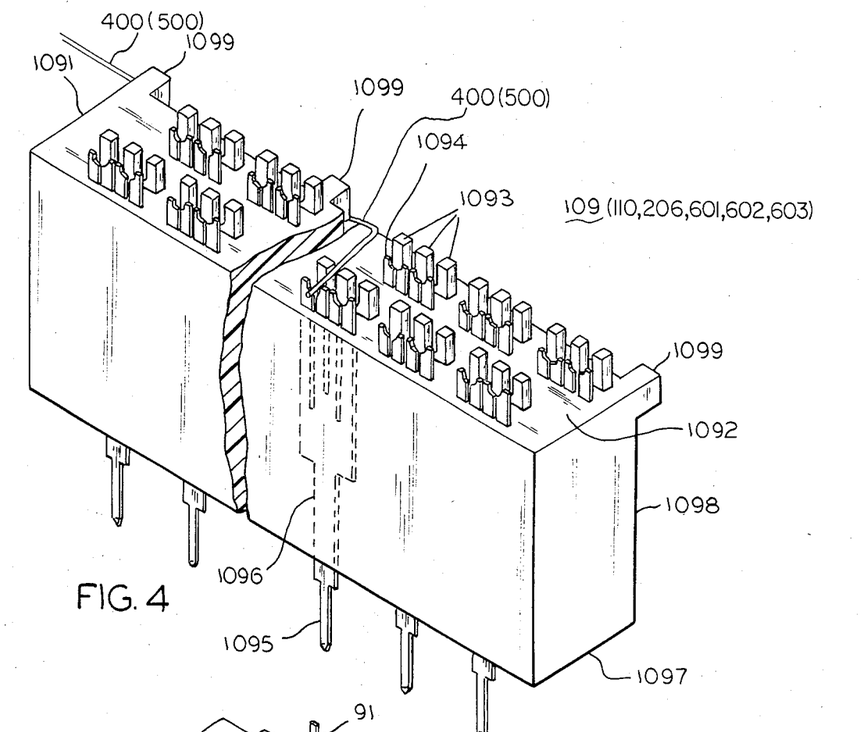
FIG. 4 is a perspective view of a terminal block shown in FIGS. 2, 3A and 3B.

Referring now to FIG. 4, each structure of the first, second and third terminal blocks 109, 110 and 206 will be described in detail. The block 109 (110 and 206) is formed of a housing 1091 made of a synthetic resin. A plurality of integral strain relief members 1093 project from a first wall 1092 of the housing 1091. A plurality of U-groove clip terminals 1096 are provided on the housing 1091. Each wire press-connection portion 1094 of the terminals 1096 is exposed from the wall 1092. Each lead portion 1095 of the terminals 1096 is to be connected to the back wiring board. Portion 1095 projects from a second wall 1097 which is opposite the wall 1092. A plurality of wire guides 1099 project integrally from a third wall 1098 and are adjacent the wall 1092.

Each of the clip terminals 1096 has two wire press-connection portions 1094. One piece of wire (insulated wire) 400 or 500 is pressed in each portion 1094 by means of a proper connection tool. When connected to the clip terminal 1096, one end portion of the wire 400 or 500 is simultaneiously pressed and held in a U-groove portion of the strain relief member 1093 corresponding to each terminal. Accordingly, one end portion of the wire is electrically and mechanically connected to the terminal 1096 and the relief member 1093. The wire 400 or 500 having its one end portion connected to the terminal 1096 is led out to alignment on the third wall side on which the wire guides 1099 project across a first wall face of the housing 1091.

The three wire guides 1099 are provided on the wall 1098, as shown in FIG. 4. A number of the guides 1099 are provided at equal intervals, according to a length of the housing 1091. Consequently, the wire 400 or 500 led out to the third wall side can be prevented from floating to the first wall side by the guides 1099. The terminals 1096 and the strain relief members 1093 are disposed in two rows which extend longitudinally along the first wall 1092 of the housing 1091 and are given in an alternately-opposite arrangement (or zigzag arrangement) to avoid a mutual mechanical interference of a plurality of wires which are being led in and led out.

The terminal blocks 109 are mounted on the BWB 106 (FIG. 2) by inserting the lead portion 1095 of the clip terminals 1096 for soldering in the through-hole provided on the BWB 106. Each of the first, second and third terminal blocks 109, 110 and 206 is arranged to have the first wall 1092 presented to a front side and the third wall 1098 presented on an upper side to the MDF frame 10. Then, the block 109 and the blocks 110 and 206 have a different number of terminals. Each of the blocks 109, 110 and 206 has the same structure.

Referring to FIGS. 1 to 5, a description will be given of a wiring procedure or "station-wiring" carried out on the MDF frame 10 and the MDF board 30 in the switching office. A description will also be given of a wiring procedure or "factory-wiring" carried out on the MDF board 30 in the factory of the manufacturing company. After having the first board assembly 100 and the second board assembly 200 built up to an integrated structure mounting the first and second shelves 104 and 202 in the manufacturing company factory, the double-sided MDF board 30 is carried into the switching office, and mounted on the MDF frame 10 shown in FIG. 1. In this case, the board 30 can also be mounted on the frame 10 before it is carried into the switching office.

Figure 5:
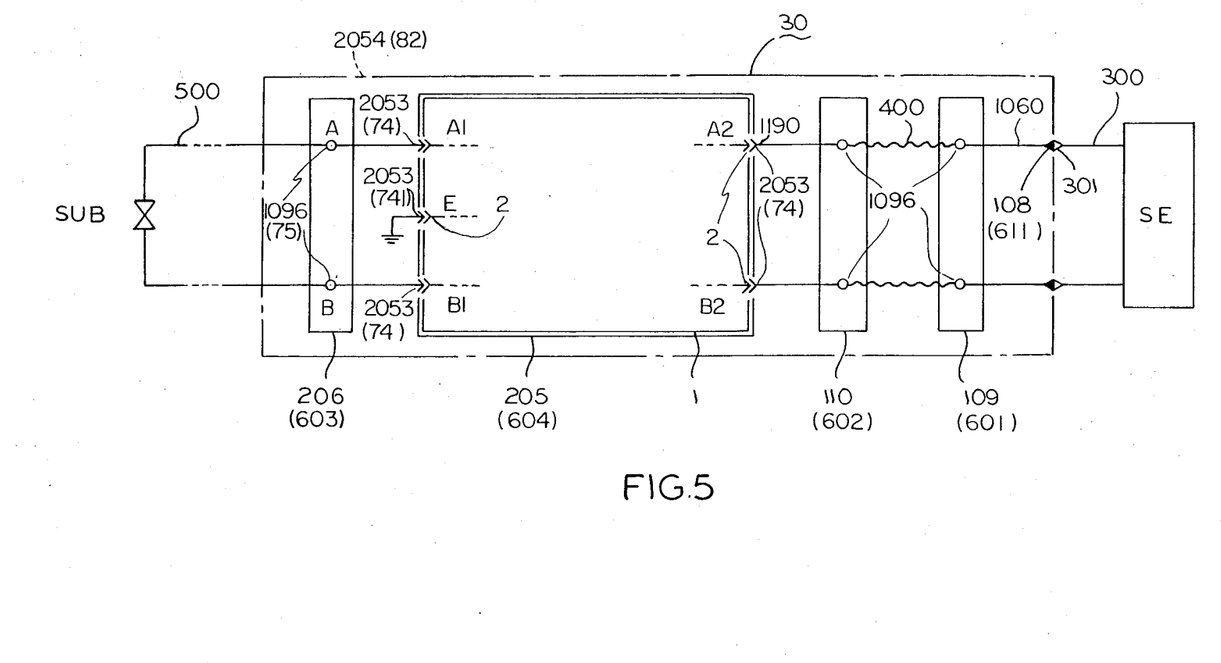
FIG. 5 is a wiring diagram of the MDF boards shown in FIGS. 2, 3A and 3B.

Then, the inside cable 300 is connected to the male interface connector 108 (FIG. 2) of the assembly 100 which is positioned on the front side of the board 30. Connector 108 receives the female interface connector 301 which is coupled to one end of the cable. Another end of the inside cable 300 is connected to the switching equipment (SE) (FIG. 5). A plurality of the inside cables 300 are introduced over the MDF frame 10 and are distributed to the corresponding MDF board 30 through a middle area of the cable support 19 fixed on the second and third vertical frame members 12 and 13. Then, one end of the outside cable 500 is connected by a press-fit to the U-groove clip terminals 1096 of the third terminal blocks 206 of the board assembly 200 which is positioned on the rear side of the MDF frame 10 (best shown in FIG. 4). The opposite end of the cable 500 is connected to a subscriber station (SUB) (FIG. 5). A plurality of the outside cables 500 are introduced via the MDF frame 10 and are distributed to the corresponding MDF board 30 through a rear area of the cable support 19.

Further, the jumper wires 400 are connected by a press-fit to the U-groove clip terminals 1096 of the first and second terminal blocks 109 and 110 of the MDF frame 10 (best shown in FIG. 4). In this case, the jumper wires 400 are held and straightened by the jumper rings 111 mounted on the MDF board 30. Then, the other jumper wires 400 connected to the board 30 are held and straightened through a front area on the cable supports 19. Further, the jumper wires 400 are connected to the board 30 of the other MDF frame 10 and are wired through the jumper duct 17 or 18 (FIG. 1) after passing the supports 19.

As described above, the station-wiring for the inside cables, the outside cables and the jumper wires can be effected through a use of plug-in and press-in operations, all from the front side of the first and second board assemblies 100 and 200 mounted on the MDF board 30. These operations may be carried out by either the operating company or the manufacturing company after the delivery to the switching office. The MDF board 30 for which the first, second and third terminal blocks 109, 110 and 206 and the receptacles 205 of the line protector module 1 are built up integrally so that they can easily be mounted as a unit from one direction, or from the front side of the MDF frame 10. As a result, a number of processes for station-wiring can be decreased. The completion period of the system installation can also be shortened.

On the other hand, the factory-wiring for the MDF board 30 comprises a first connection between the interface connectors 108 of the assembly 100 and the first terminal blocks 109. Second, a connection is made between the second terminal blocks 110 of the assembly 100 and the receptacles 205 of the assembly 200. Third, a connection is made between the third temrinal blocks 206 of the assembly 200 and the receptacles 205. In the MDF board 30, the wiring for the first and third connections is carried out with a printed conductive pattern on a printed circuit board, preferably by means of a back wiring board (BWB) in order to decrease the number of the processes required for the factory-wiring. These printed circuit boards prevent misconnection and also miniaturize and thin the board 30.

The wiring for the second connection between the second terminal blocks 110 and the receptacles 205 which cannot be formed by the use of the printed conductive pattern is carried out by wrapping insulated wires 1190 around the terminals 1096 and 2053 projecting from the near side of the BWB's 106 and 1203, respectively, as shown in FIG. 3B. The wiring can be achieved by applying a normal wire-wrap method.

Figure 6A:
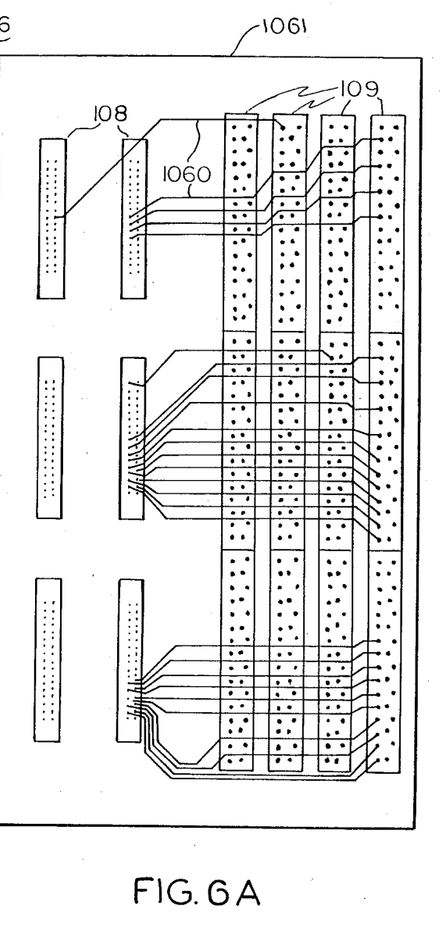
FIGS. 6A, 6B and 6C show a printed circuit conductive pattern on a back wiring board shown in FIGS. 2, 3A and 3B.
Figure 6B:
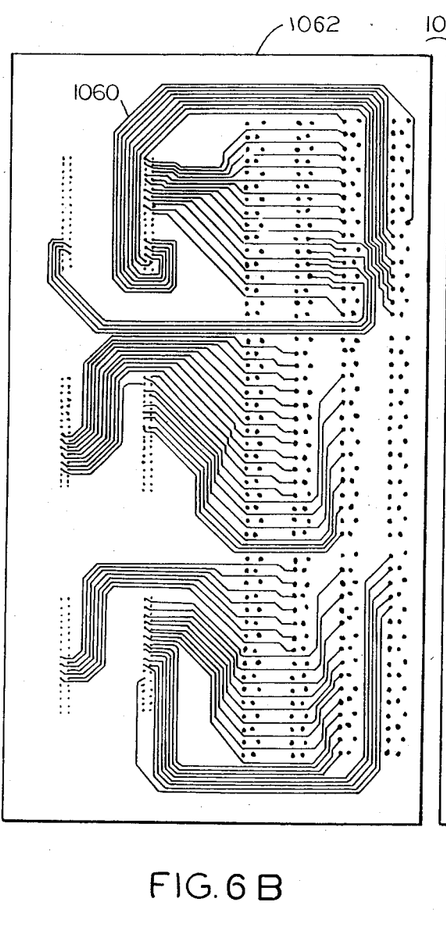
Figure 6C:
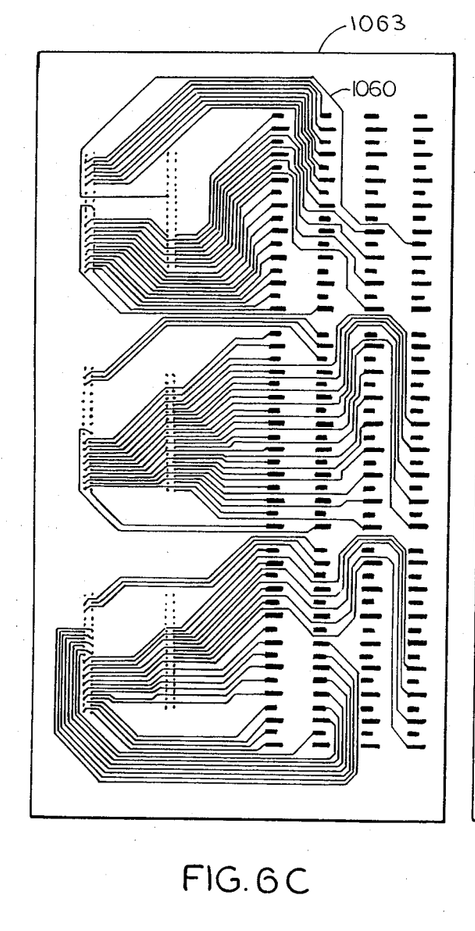

One example of the BWB for which a wiring between the interface connectors 108 and the first terminal blocks 109 is carried out with the printed conductive patttern is shown in FIGS. 6A, 6B and 6C. Since the MDF board 30, in this example, comprises an enclosing of the inside cable for 96 lines, it is necessary to form 192 pieces (for 96 lines) of conductive patterns 1060 between the interface connectors 108 and the first terminal blocks 109. If the patterns 1060 are formed on one piece of the BWB, to prevent the conductive patterns 1060 from interfering with each other, the size of the BWB becomes very big to require a large-sized structure of the board 30. Therefore, as shown in FIGS. 6A to 6C, it is preferable that the 192 pieces of conductive patterns 1060 be formed in divisions, on three pieces of BWB's 1061, 1062 and 1063, which will become integrated by stacking them. Likewise, the wiring 2054 (FIG. 5) between the third terminal blocks 206 and the receptacles 205 can be formed from the conductive pattern by stacking a plurality of the BWB's. Further, all ground terminals 2050(E) of receptacles 205 can be connected in multiple by a printed conductive pattern formed on the BWB, as shown in detail in FIG. 9. The multiple-connected ground terminals 2053(E) are connected to one of the ground bars 21, which is fixed on frame members 11 and 14, via a ground wire 2055 having a clamping member 2056 at the free end (shown in FIGS. 2 and 3B).

Figure 7:
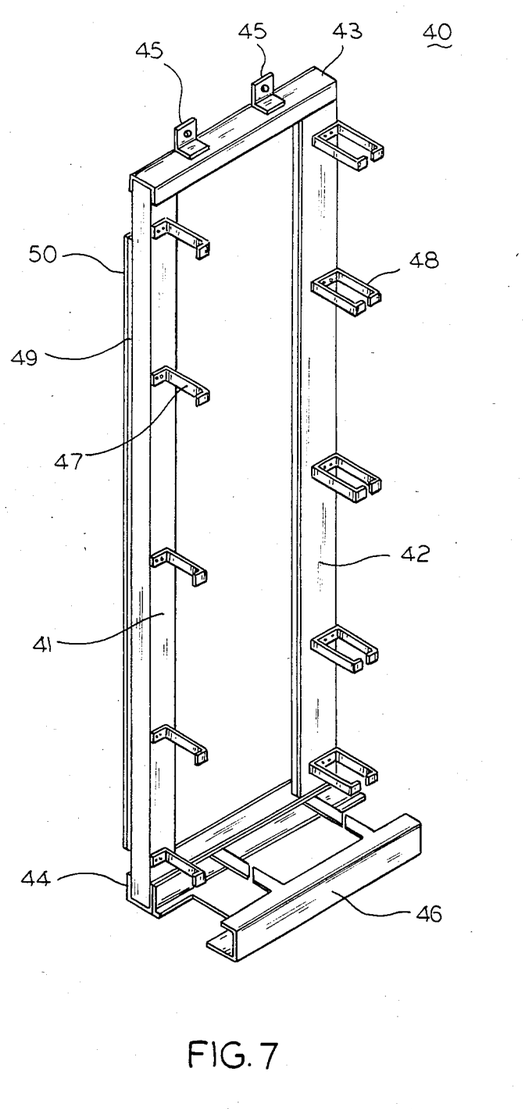
FIG. 7 is a perspective view of a second embodiment of the invention.

Referring then to FIG. 7, a frame 40 is provided with an MDF board and is employed in the second embodiment with first and second vertical frame members 41 and 42. These members are P-shaped in cross-secton and are located opposite each other at a predetermined interval. The frame 40 also has first and second horizontal frame members 43 and 44, which are U-shaped in cross-secton and are fixed on their upper end portions and lower end portions on the vertical frame members 41 and 42 respectively. A pair of brackets 45 is provided on the first horizontal frame member 43 to fix the MDF frame 40 on a wall of the switching office. A jumper duct 46 is fixed on the front side of the frame member 44 to pass jumper wires. Five pieces of cable supports 47 are changed on a front wall surface of the frame member 41 to hold and straighten outside cables. Five pieces of cable supports 48 are clamped on a front wall surface of the frame member 42 to hold and straighten inside cables. Ground bars 50 are clamped on the frame members 41 and 42, but are separated therefrom by insulation spacers 49. A single-sided MDF board is described in detail hereinafter and is mounted in seven pieces between the frame members 41 and 42 of the MDF frame 40. The MDF board is capable of distributively connecting outside cables of 100 lines per piece; therefore, one MDF frame 40 has a capacity of accepting a maximum of 700 lines. Further, the frame 40 is 2,100 mm high, 630 mm wide and 300 mm deep, which is effective to save an occupied area in the switching office.

Figure 8:
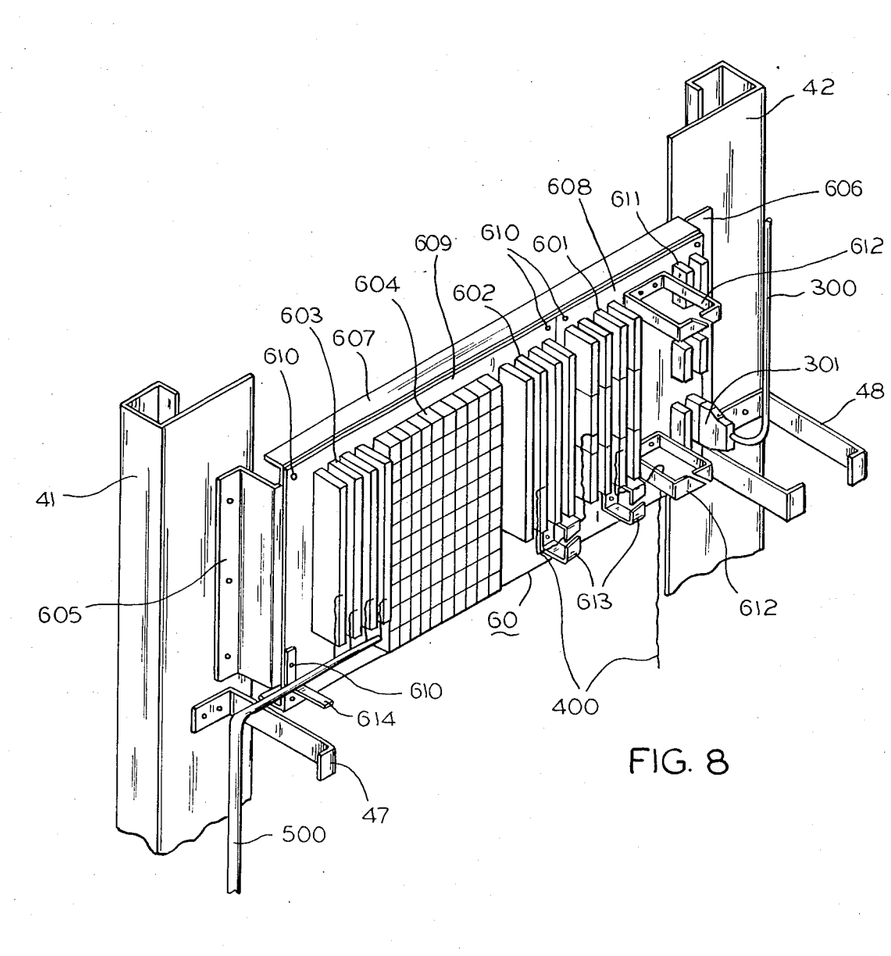
FIG. 8 is a perspective view of an MDF board mounted on the MDF frame shown in FIG. 7.

Referring next to FIG. 8, a single-sided MDF board 60, in the second embodiment, is mounted on the MDF frame 40. First, second and third terminal blocks 601, 602 and 603 and receptacles 604 are disposed on only the front side of the first and second vertical frame members 41 and 42 of the frame 40. The board 60 has a metallic mounting shelf 607 with a pair of nearly L-shaped brackets 605 and 606 clamped on the frame members 41 and 42. First and second glass epoxy resin back wiring boards 608 and 609 are fixed on the shelf 607 with nylon rivets 610. The first back wiring board (BWB) 608 is mounted with six pieces of male-type interface connectors 611 connected to female-type interface connectors 301 of the inside cables 300, at the right-hand portion, respectively and twelve pieces of first terminal blocks 601 are mounted at the left-hand portion for connecting the jumper wires 400. The male connectors 611 and the first terminal blocks 601 are identical in structure with the connectors 108 and the blocks 109 in the above first embodiment (FIGS. 2 and 4), respectively.

Jumper rings 612 and 613 hold and straighten the jumper wires 400 and are disposed on the left lower portion. The rings 612 and 613 are fixed on the shelf 607 with the nylon rivets 610 which extend through the BWB 608. Here, a factory-wiring can be installed between the male connectors 611 and the terminal blocks 601 by using the printed conductive patterns 1060 shown in FIGS. 6A, 6B and 6C. On the other hand, the second BWB 609 is mounted with four pieces of the second terminal blocks 602 for connecting the jumper wires 400 at the right-hand portion, 100-pieces of the receptacles 604 at the center portion, and four pieces of the third terminal blocks 603 are connected to the outside cable 500 at the left-hand portion. The receptacles 604 and the terminal blocks 602 and 603 are identical, on construction and the factory-wiring, with those of the first embodiment (FIGS. 2, 3A, 3B and 4). The wiring (not shown) between the ground bars 50 and the ground terminals of the receptacles 604 which is installed by ground wires 2055 is also identical with that of the first embodiment. Then, the jumper ring 613 is disposed on the right lower portion of the BWB 609. A cable support 614 for holding the outside cable 500 is disposed on the left lower portion.

The single-sided MDF board 60 is built in integration form by factory mounting the first and second BWB's 608 and 609 on the mounting shelf 607 in the manufacturing company. After having a factory wiring applied thereto, board 60 is carried into the switching office where it is mounted on the MDF frame 40 shown in FIG. 7. Then, the frame 40 with the board 60 already mounted thereon can also be delivered in that form.

In both cases, the MDF board 60 uses component parts such as the terminal blocks 601, 602 and 603, the receptacles 604, and others, which are integrated in structure and which can easily be mounted on the frame 40 from one direction, or from the front side, of the frame 40. Further, when the factory-wiring is carried out by wire wrapping, all of the connections will be facilitated for ready access from the rear side of the board 60. Furthermore, after delivery, the station-wiring to the board 60 can be performed all through plug-in and press-in operations from the front side of the board 60. Wirings of the jumper wires 400 between the boards 60 and between the frames 40, the inside cable 300 and the outside cable 500 can all be carried out from the front side of the frame 40 and the board 60. Accordingly, the MDF frame 40 can be fixed on the wall of the switching office by employing the MDF board 60. Then, a wiring diagram of the MDF board 60 is similar to that of FIG. 5.

Figure 9:
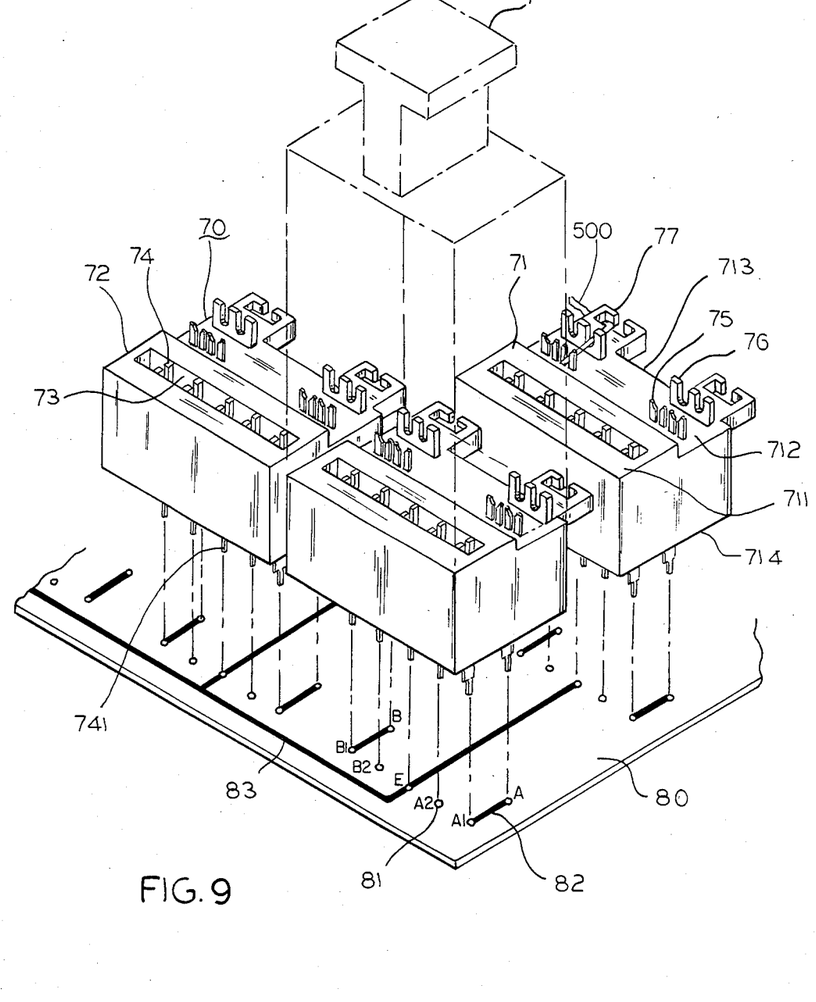
FIG. 9 is a perspective view of a modification to the first and second embodiments.

Referring further to FIG. 9, a receptacle 70 represents a modification to the first and second embodiments. The receptacle 205 of the double-sided MDF board 30 of the first embodiment, the third terminal block 206 for connecting the outside cable 500 or the receptacle 604 of the single-sided MDF board 60 of the second embodiment, and the third terminal 603 are all integrated, in construction. A further miniaturization of the MDF board can thus be attained. Moreover, the factory-wiring between the receptacle and the third terminal block can be formed easily with the printed conductive pattern.

That is, the receptacle 70 comprises a housing 72 made of a synthetic resin and having one stepped wall 71. Five pieces of thin-platelike, U-groove (female) contact terminals 74 are enclosed in a slot 73 and are exposed to a higher portion 711 of the stepped wall 71 of the housing 72. A pair of U-groove clip terminals 75 with a wire press-connection portion (U-groove portion) projects from the housing 72 at a lower portion 712 of the stepped wall 71. A pair of strain relief members 76 project from the lower portion 712 of the stepped wall 71, opposite each terminal. A pair of C-shaped wire guides 77 project from a side wall 713 adjacent the stepped wall 71.

The receptacle 70 is mounted on a back wiring board 80 by having each lead portion of the terminals 74 and 75, projecting from a bottom wall 714 of the housing 72, inserted into a corresponding through-hole 81 of the back wiring board 80. One end portion of a pair of wires of the outside cable 500 is connected to each U-groove portion of the paired clip terminals 75 projecting from the lower portion 712 of the stepped wall 71. Each of these wires is held by the strain relief members 76 and is straightened by the wire guides 77. The clip terminals 75 for connecting the outside cable 500 and the female contact terminals 74 for accepting the line protector module 1 are interconnected by printed conductive patterns 82 formed on the BWB 80. The lead portions of the terminals 74 (A2 and B2) projecting from the near side of the BWB 80 can be connected to the lead portions of the terminals 1096 of the second terminal blocks 110 and 602 in the MDF boards 30 and 60 by wrapping with an insulated wire 1190 as shown in FIG. 3B. Further, ground terminals 741 of each receptacle 70 are all connected in multiple by a printed conductive pattern 83 formed on the BWB 80. The terminals 741 can be connected to the ground bars on the frame via the ground wire 2055.

If the protector module 1 is inserted into the receptacle 70, the lower portion 712 of the housing 72 of the receptacle 70 will be covered by a bottom wall surface of the module 1. Wires of the outside cable 500 are pressed in and so are connected to the clip terminals 75 to prevent dislodgement responsive to an unexpected force which is applied externally. Further, the receptacle 70 has the U-groove portions of the terminals 74 on the housing 72 arrayed in one slot 73. Receptacle 70 is employed to realize an acceptance of the line protector module (not shown) for which the male contact terminals are printed and formed integrally on an end portion of a printing circuit board (not shown) mounted with circuit component parts of the protector module 1. Needless to say, the receptacle 70 is capable of accepting the line protector module 1 shown in FIG. 3. Further, the BWB 80 suppoting the receptacle 70 is mounted on the mounting shelf of the MDF frame so as to keep the wire guides 77 positioned below.

Figure 10:
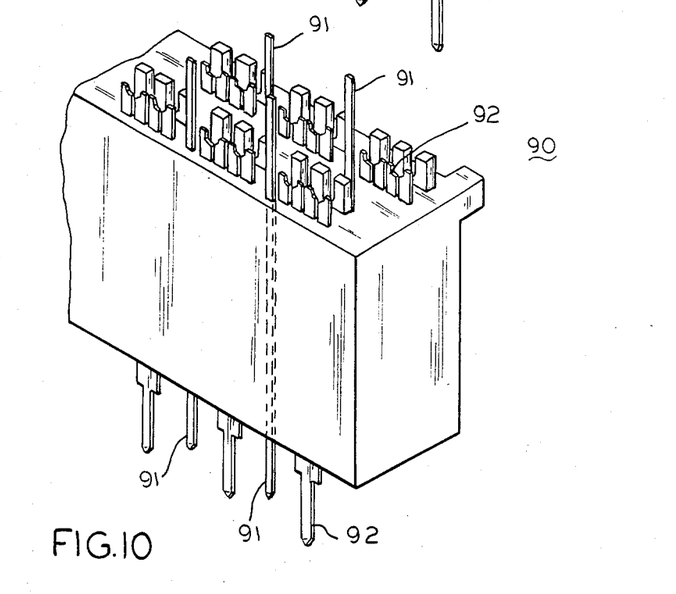
FIG. 10 is a perspective view of another modification to the first and second embodiments.

Referring to FIG. 10, a terminal block 90 is another modification to the first and second embodiments. Post terminals 91 facilitate various tests such as a pseudo-call test and the like, these posts being added to the terminal block shown in FIG. 4. Block 90 substitutes chiefly for the first teminal block for leading the inside cable in the MDF board. Maintenance personnel may carry out various tests by connecting a test plug to the post terminal projecting sufficiently from a first wall face of the housing. Each of the post terminals 91 is connected to adjacent U-groove clip terminals 92 through a printed conductive pattern of the back wiring board.

Other alternatives and modifications to the above-mentioned embodiments can be made within the scope of the invention defined by the appended claims.

What is claimed is:

1. A main distributing frame board mounted on a pair of vertical frame members of a main distributing frame of a switching office and interconnecting an inside cable connected to a switching equipment of said switching office and an outside cable connected to a subscriber station, said frame board comprising:
   a plug-in type connector connected to said inside cable;
   a first terminal block having U-groove clip terminals connected to said connector;
   a second terminal block having U-groove clip terminals connected via jumper wires to said clip terminals of said first terminal block,
   each of said first and second terminal blocks having U-groove portions of said clip terminals projecting toward a front housing wall, said clip terminals being arrayed in two zigzag rows, and lead portions projecting towards a housing rear portion, strain relief members provided close to said U-groove portions, and wire guide means provided on a housing side wall;
   a third terminal block having U-groove clip terminals connected to said outside cable;
   a receptacle integral with said third terminal block and having female contact terminals connected to said clip terminals of said second and third terminal blocks and a female contact terminal for making a ground connection and for receiving male contact terminals of a protector module having a protection device, said receptacle with said female contact terminals coming into contact with said male contact terminals of said protector module, said terminals being disposed in a row in a slot exposed to said front wall, said slot being arranged at a higher stepped portion of said front wall to dispose said female contact termainals therein, and U-groove clip terminals and strain relief members for wires which are press-connected into said clip terminals, said clip terminals and strain relief members being disposed at a lower stepped portion following said higher stepped portion, said receptacle having a wire guide on a side wall adjacent to said front wall;
   at least one back wiring board having said connector, said first, second and third terminal blocks, and said receptacle mounted thereon;
   a shelf with said back wiring board fixed thereon and integrally mounting said connector, said first, second and third terminal blocks and said vertical frame member of said main distributing frame, said shelf having a pair of brackets and being fixed on said brackets to a pair of vertical frame members of said main distributing frame, said connector and said clip terminals of said first terminal block being oonnected through a printed conductive pattern formed on said back wiring board, said receptacle and said clip terminals of said third terminal block being connected through a printed conductive pattern formed on said back wiring board, and a ground connection terminal of said receptacle being grounded through a printed conductive pattern formed on said back wiring board.

2. The main distributing frame board as claimed in claim 1, wherein said third terminal block is integral with said receptacle.

3. The main distributing frame board as claimed in claim 2, wherein said receptacle with said female contact terminals come into contact with said male contact terminals of said protector module, said terminals being disposed in a row in a slot exposed to a front wall.

4. The main distributing frame board as claimed in claim 3, wherein said slot is arranged at a higher stepped portion of said front wall to dispose said female contact terminals therein, and U-groove clip terminals and strain relief members for wires which are press-connected into said clip terminals, said clip terminals and strain relief members being disposed at a lower stepped portion following said higher stepped portion.

5. The main distributing frame board as claimed in claim 4, said receptacle having a wire guide on a side wall adjacent to said front wall.

6. The main distributing frame board as claimed in claim 5, wherein each of said first and second terminal blocks has U-groove portions of said clip terminals projecting toward a front housing wall, said clip terminals being arrayed in two zigzag rows, and each lead portion projecting toward a housing rear portion, said strain relief member being provided close to said U-groove portion, and said wire guide being provided on a housing side wall.

7. The main distributing frame board as claimed in claim 6, wherein said connector and said clip terminals of said first terminal block are connected through a printed conductive pattern formed on said back wiring board.

8. The main distributing frame board as claimed in claim 7, wherein said receptacle and said clip terminals of said third terminal block are connected through a printed conductive pattern formed on said back wiring board, and a ground connection terminal of said receptacle being grounded through a printed conductive pattern formed on said back wiring board.

9. The main distributing frame board as claim in claim 8, wherein said receptacle and said clip terminals of said second terminal block are connected through a printed conductive pattern formed on said back wiring board.

10. The main distributing frame board as claimed in claim 1, wherein said connector and said clip terminals of said third terminal block are connected through a printed conductive pattern formed on said back wiring board.

11. The main distributing frame board as claimed in claim 10, wherein said receptacle and said clip terminals of said third terminal block are connected through a printed conductive pattern formed on said back wiring board, and a ground connection terminal of said receptacle being grounded through a printed conductive pattern formed on said back wiring board.

12. The main distributing frame board as claimed in claim 11, wherein said receptacle and said clip terminals of said second terminal block are connected through a printed conductive pattern formed on said back wiring board.

13. The main distributing frame board as claimed in claim 1, wherein each of said first and second terminal blocks has U-groove portions of said clip terminals projecting toward a housing front wall and arrayed in two zigzag rows, and each lead portion projects toward a housing rear portion, a strain relief member being provided to said U-groove portion, and a wire guide being provided on a housing side wall.

14. The main distributing frame board as claimed in claim 1, wherein said first terminal block has post terminals, each of said post terminals projecting from said housing front wall and said housing rear wall.

15. The main distributing frame board as claimed in claim 1, wherein said shelf has a pair of brackets and is fixed on said brackets to a pair of vertical frame members of said main distributing frame.

16. The main distributing frame board as claimed in claim 1, wherein said shelf comprises a first shelf member positioned at a front side and a second shelf member positioned at a rear side of said main distributing frame, and said first and second shelf members being coupled to each other with one of said members being fixed on a pair of vertical frame members of said main distributing frame via a pair of brackets.

17. The main distributing frame board as claimed in claim 1, wherein a first back wiring board has said connector and said first and second terminal blocks mounted thereon, said wiring board being fixed first on said first shelf member, and a second back wiring board having said third termianl block and said receptacle mounted thereon, said second wiring board being fixed on said second shelf member.

18. A main distributing frame board as claimed in claim 1, wherein said receptacle and said clip terminals of said third terminal block are connected through a printed conductive pattern formed on said back wiring board, and a ground connection terminal of said receptacle is grounded through a printed conductive pattern formed on said back wiring board.

* * * * *

UNITED STATES PATENT AND TRADEMARK OFFICE
CERTIFICATE OF CORRECTION

PATENT NO. : 4,603,377
DATED : July 29, 1986
INVENTOR(S) : Kobayashi et al

It is certified that error appears in the above—identified patent and that said Letters Patent is hereby corrected as shown below:

IN THE FOREIGN APPLICATION PRIORITY DATA

Oct. 24, 1983 [JP] Japan.................. 58-198450
Oct. 24, 1983 [JP] Japan.................. 58-198451
Oct. 24, 1983 [JP] Japan.................. 58-198452
Oct. 24, 1983 [JP] Japan.................. 58-198453

Signed and Sealed this

Twenty-fifth Day of November, 1986

Attest:

DONALD J. QUIGG

Attesting Officer    Commissioner of Patents and Trademarks